US008022556B2

(12) United States Patent
Selmeier et al.

(10) Patent No.: US 8,022,556 B2
(45) Date of Patent: Sep. 20, 2011

(54) ELECTRICAL COMPONENT HAVING A REDUCED SUBSTRATE AREA

(75) Inventors: Peter Selmeier, Maitenbeth (DE); Tobias Krems, Munich (DE)

(73) Assignee: EPCOS AG, Munich (DE)

( * ) Notice: Subject to any disclaimer, the term of this patent is extended or adjusted under 35 U.S.C. 154(b) by 631 days.

(21) Appl. No.: 10/542,841

(22) PCT Filed: Dec. 16, 2003

(86) PCT No.: PCT/EP03/14349
§ 371 (c)(1),
(2), (4) Date: Sep. 19, 2006

(87) PCT Pub. No.: WO2004/066491
PCT Pub. Date: Aug. 5, 2004

(65) Prior Publication Data
US 2007/0029679 A1    Feb. 8, 2007

(30) Foreign Application Priority Data

Jan. 20, 2003  (DE) .................................. 103 01 934

(51) Int. Cl.
*H01L 23/48*  (2006.01)
(52) U.S. Cl. . 257/778; 257/779; 257/781; 257/E23.026; 257/E21.511; 333/193; 333/195
(58) Field of Classification Search .................. 257/737, 257/738, 736, 778, 776, 781, 779, E23.021, 257/E23.069, 772, E23.015, E23.02–E23.079, 257/E21.511; 333/193, 195; 438/612–617
See application file for complete search history.

(56) References Cited

U.S. PATENT DOCUMENTS

| 5,293,006 | A | * | 3/1994 | Yung | 174/261 |
| 5,831,493 | A | * | 11/1998 | Ushiroku | 333/193 |
| 5,872,493 | A | | 2/1999 | Ella | |
| 6,078,229 | A | * | 6/2000 | Funada et al. | 333/193 |
| 6,351,197 | B1 | | 2/2002 | Selmeier et al. | |
| 6,417,574 | B1 | | 7/2002 | Misawa et al. | |
| 6,469,593 | B2 | | 10/2002 | Nishizawa et al. | |
| 6,600,234 | B2 | * | 7/2003 | Kuwabara et al. | 257/790 |
| 6,650,207 | B1 | | 11/2003 | Tanaka | |
| 6,677,696 | B1 | * | 1/2004 | Ruile | 310/313 A |
| 6,747,530 | B1 | | 6/2004 | Selmeier | |
| 6,791,437 | B2 | | 9/2004 | Hagn et al. | |

(Continued)

FOREIGN PATENT DOCUMENTS

EP          1076414          2/2001

(Continued)

OTHER PUBLICATIONS

English Translation of Examination Report in Application No. 2004-566780, dated Jul. 22, 2009.

(Continued)

*Primary Examiner* — Jasmine J Clark
(74) *Attorney, Agent, or Firm* — Fish & Richardson P.C.

(57) ABSTRACT

An electrical component includes a substrate, component structures on the substrate, and solder metal platings electrically connected to the component structures. The substrate is electrically and mechanically connected in a flip chip arrangement to a carrier via connections formed by solder bumps. The solder bumps mate to the solder metal platings. At least one of the solder bumps is on a first solder metal plating. The first solder metal plating has first and second dimensions, where the first dimension is larger than the second dimension.

19 Claims, 12 Drawing Sheets

U.S. PATENT DOCUMENTS

| | | |
|---|---|---|
| 7,518,249 B2 | 4/2009 | Krueger et al. |
| 2002/0084528 A1 | 7/2002 | Kim et al. |
| 2002/0093399 A1 | 7/2002 | Takata |
| 2003/0037959 A1* | 2/2003 | Master et al. .................. 174/256 |
| 2003/0117240 A1* | 6/2003 | Inoue et al. ................... 333/195 |
| 2003/0160665 A1 | 8/2003 | Hagn et al. |
| 2007/0029679 A1 | 2/2007 | Selmeier et al. |
| 2008/0048317 A1 | 2/2008 | Krueger et al. |

FOREIGN PATENT DOCUMENTS

| | | |
|---|---|---|
| EP | 1195896 | 4/2002 |
| EP | 1 195 896 | 10/2002 |
| EP | 1 274 167 | 8/2003 |
| JP | 07-321247 | 12/1995 |
| JP | 09-102517 | 4/1997 |
| JP | 10-270979 | 10/1998 |
| JP | 10-284500 | 10/1998 |
| JP | 11-122072 | 4/1999 |
| JP | 2001-053577 | 2/2001 |
| JP | 2001-127586 | 5/2001 |
| JP | 2001-267881 | 9/2001 |
| JP | 2002-217227 | 8/2002 |
| WO | WO 01/76064 | 11/2001 |
| WO | WO01/82480 | 11/2001 |

OTHER PUBLICATIONS

Machine Translation of Japanese Application No. 07-321247.
Machine Translation of Japanese Application No. 09-102517.
Machine Translation of Japanese Application No. 10-284500.
Machine Translation of Japanese Application No. 11-122072.
Machine Translation of Japanese Application No. 2001-127586.

* cited by examiner dim1 > dim2

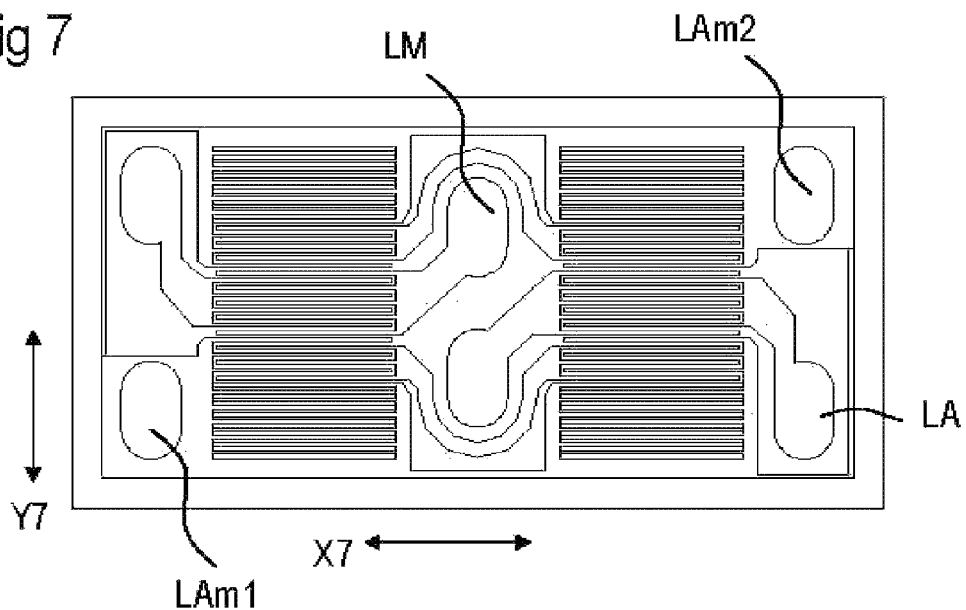
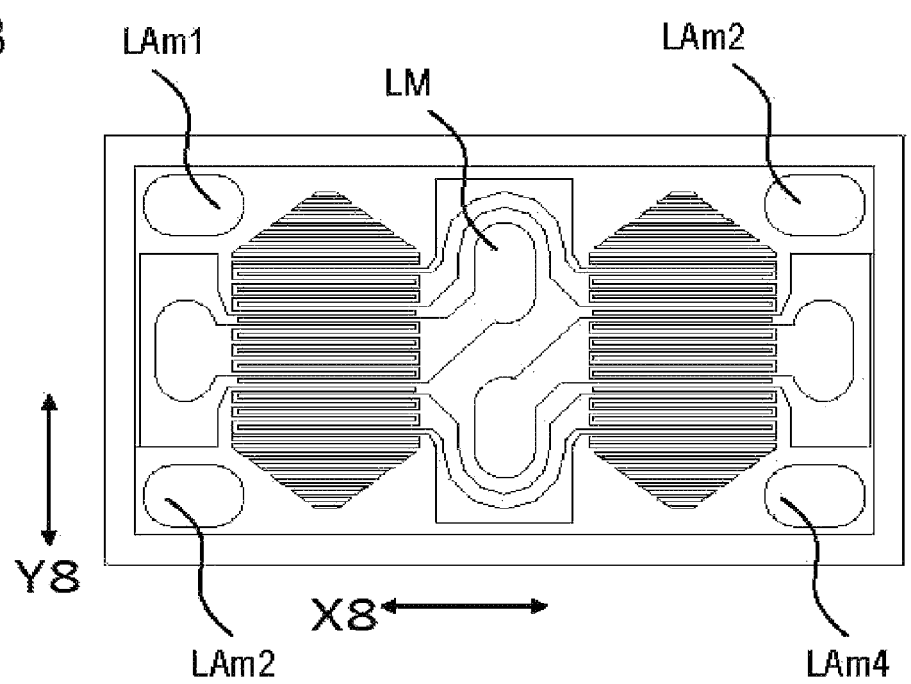

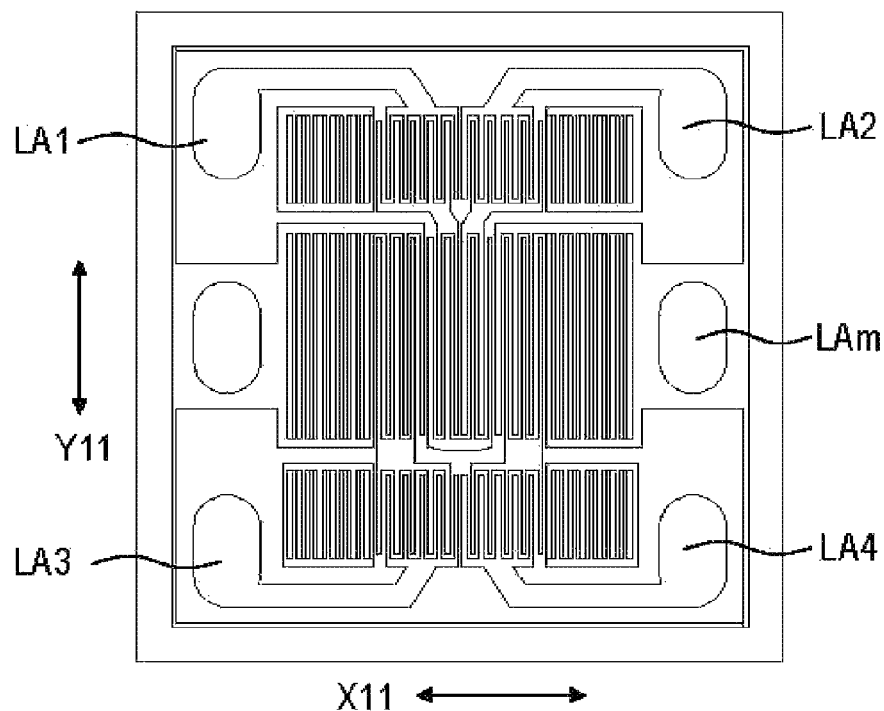
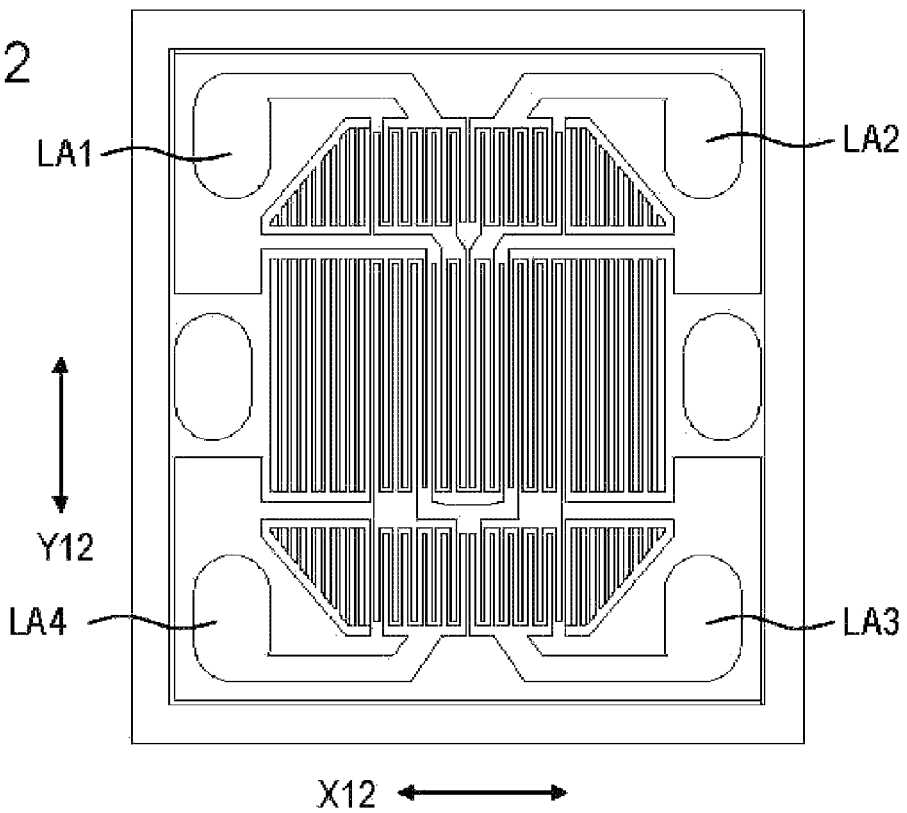

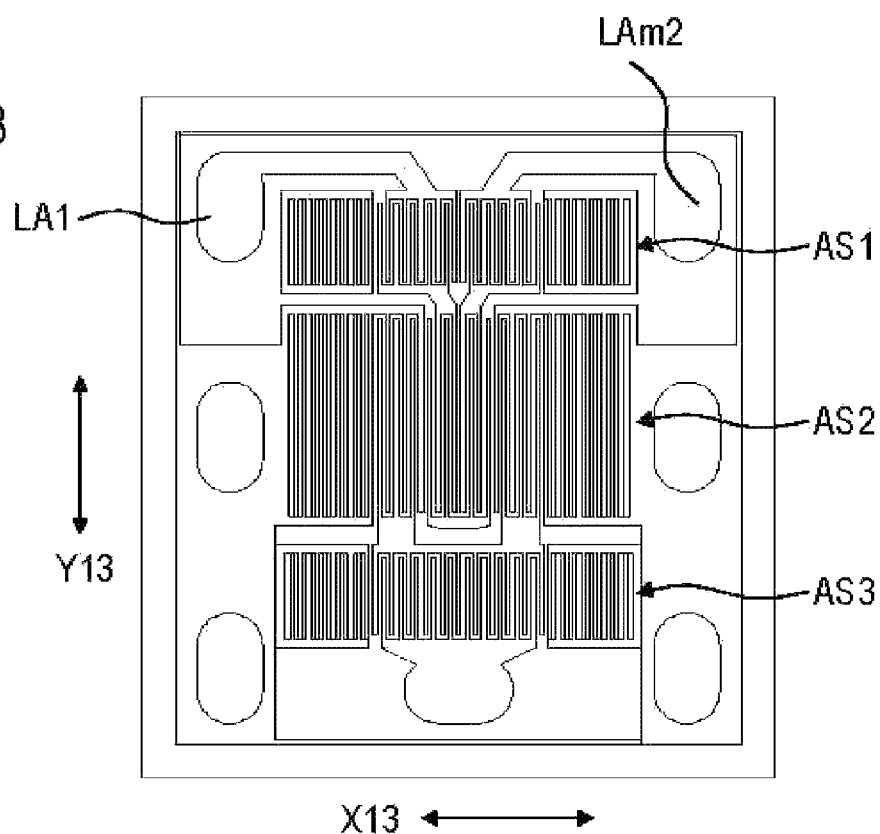
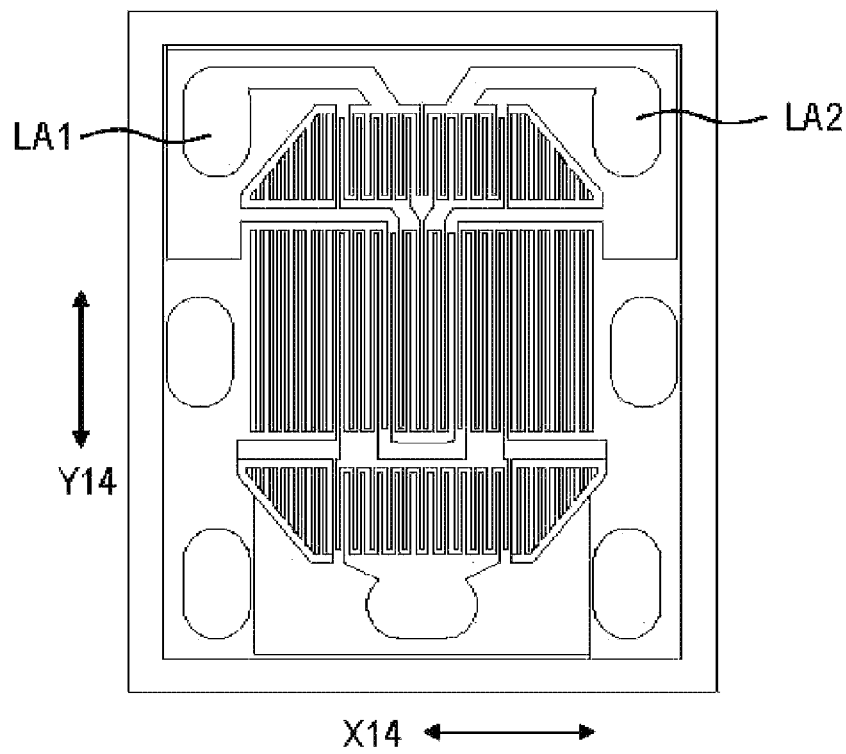

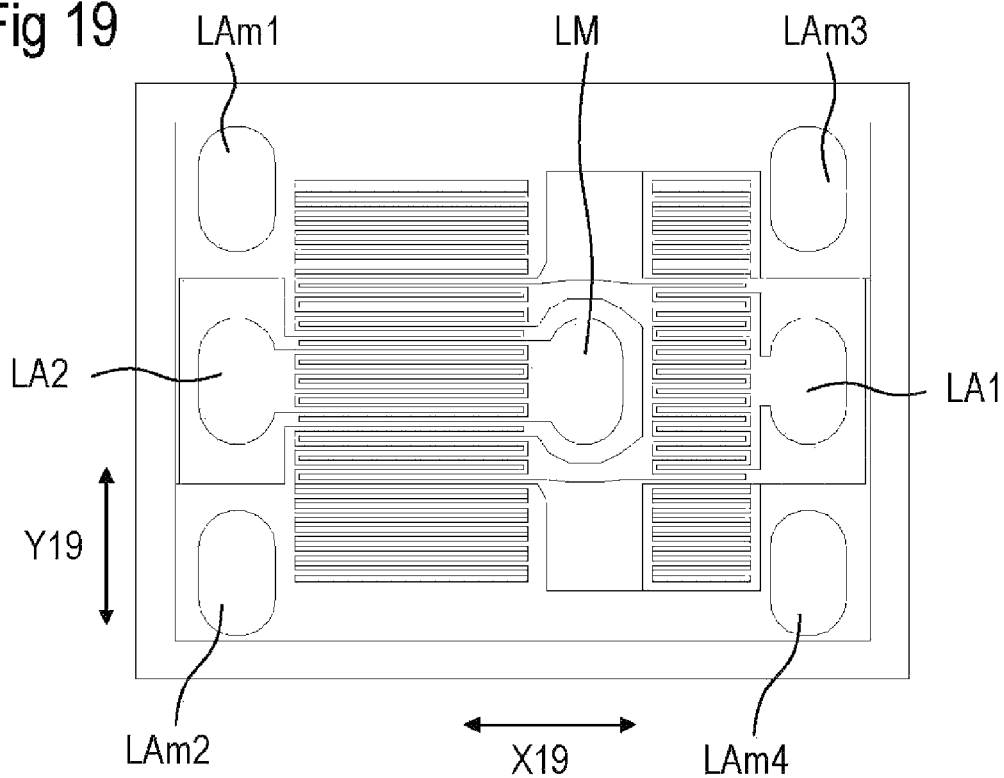
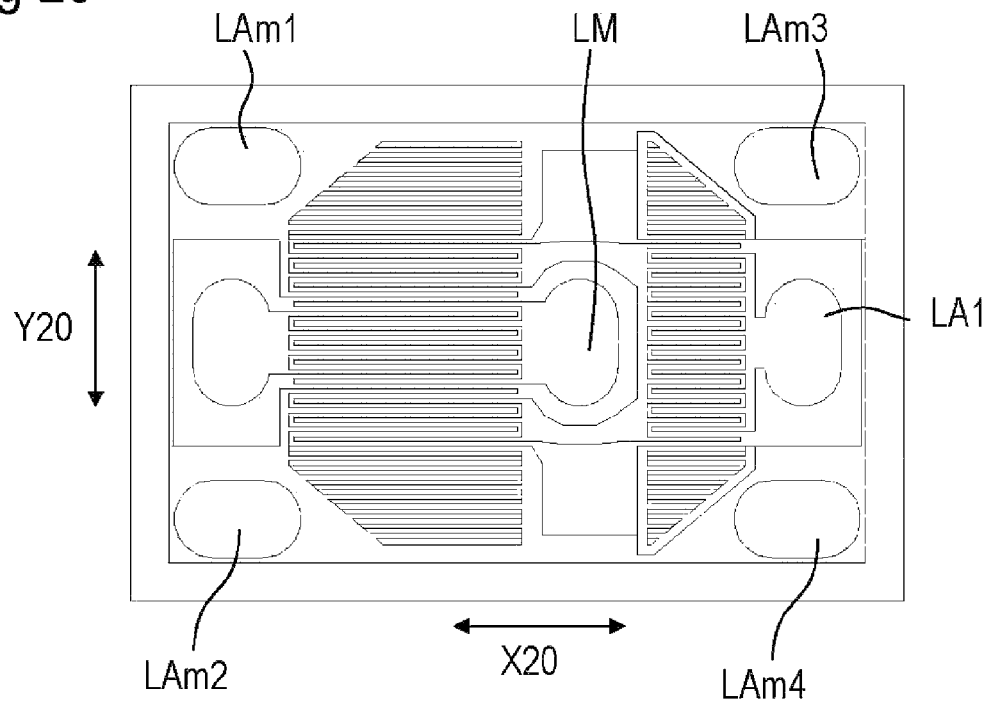

ELECTRICAL COMPONENT HAVING A REDUCED SUBSTRATE AREA

TECHNICAL FIELD

The present invention relates to the chip layout of electrical components, whose substrate is electrically and mechanically connected in a flip chip arrangement to a carrier via bump connections formed by solder bumps.

The present invention relates to all electrical components which have sensitive component structures, particularly on a surface of their substrate, and are preferably processed in a flip chip arrangement. These are particularly components operating with acoustic waves such as SAW (surface acoustic wave) components, BAW (bulk acoustic wave) components, or FBAR (thin film bulk acoustic wave resonator), as well as MEMS (micro electromechanical systems) and MOEMS (micro opto-electro-mechanical systems).

BACKGROUND

SAW components typically contain one or more piezoelectric substrates and a housing and/or a carrier for receiving the piezoelectric substrate(s).

The piezoelectric substrate has interdigital transducers and reflectors as component structures, which are photolithographically structured in a thin metallic layer. The interdigital transducers comprise electrode and busbar regions, the reflectors comprise parallel reflector fingers and, if necessary, busbar regions which electrically connect them.

Some busbar regions are expanded into electrical contact points referred to as bond pads, at which the different potentials of the interdigital transducers and reflectors are transmitted via soldered connections to a suitable carrier, which may also be a housing or a part thereof.

One group of SAW components are the SAW filters referred to as DMS filters (double mode resonator filters) or also CRF filters (coupled resonator filters). They use multiple resonating regions which are acoustically and electrically coupled in order to achieve a desired transmission function.

A typical DMS filter has two acoustic tracks, each of which comprises a middle interdigital transducer having two busbars and bond pads, framed by a further interdigital transducer on each side and two reflectors on the two ends of these interdigital transducers. The bond pads of the middle interdigital transducer are, for example, connected on one side to the ground bond pads of the neighboring reflector, on the other side, the busbar is electrically connected to the busbar of the corresponding interdigital transducer from the second track. The connection pad used for the connection is electrically "floating" in relation to the electrical potentials of the middle interdigital transducer.

A further group of SAW components are the ladder-type filters. A ladder-type filter comprises at least one ladder base element, which is composed of a first resonator (series resonator), connected in series from the input to the output, and a second resonator (parallel resonator), which is connected in parallel to ground. A single resonator typically has an interdigital transducer structure including two busbars and bond pads and a reflector structure at each of the two ends. Typically, multiple such base elements are electrically connected in series one after another, multiple resonators of the same type also able to be assembled into one acoustic track. To electrically connect two series resonators, the output busbar of the first series resonator is linked to the input busbar of the second series resonator using a line. A branch from this connection line to the input busbar of the parallel resonator generates the electrical connection of the parallel resonator lying between them.

A third group of SAW components are the DMS filters having additional resonators, i.e., a mixture of DMS and ladder-type filters. Usually, an acoustic DMS track is combined with one or more resonator structures (series and/or parallel resonators). If a DMS track is combined with two series resonators, for example, a first series resonator is electrically connected to the first busbar of the middle transducer. The second busbar is expanded into a bond pad, for example. The external interdigital transducers are connected on one side to the ground bond pads of the neighboring reflector, and on the other side the two busbars are joined together and electrically connected to the second series resonator. Thus, a series circuit made of resonator, DMS track, and further resonator results. Bond pads are externally attached to each of the resonators.

A BAW resonator comprises at least one piezoelectric layer, which is positioned between at least two electrodes and is used for electro-acoustic conversion of an electrical signal applied to the electrodes. Either air on both sides (bridge-type), or a sequence of layers (solidly-mounted resonator) on one side, or a sequence of layers on both sides, each on a shared carrier (e.g., silicon) may be used as the mirror (=reflector) in this case.

Because of the miniaturization of electrical components required for many technical applications, flip chip technology has also been used for connecting the chip to a carrier in SAW and/or BAW components in recent years. The electrical connection of the chip to the housing and/or carrier is performed in this case via solder globules, bumps, which are placed on the bond pads, among other things. Carrier bond pads, which are diametrically opposite to the bond pads on the chip, are located on the carrier.

In this case, the chip is mounted upside down in the housing and/or on the carrier, so that the structured side points downward in the direction of the housing and/or carrier.

In order to produce a soldered connection between the housing and/or carrier and the first metal layer used for the acoustic structures, which comprises non-solderable aluminum and/or aluminum alloy, a second solderable metal layer, referred to in the following as the solder metal plating, is applied. This second, solderable metal layer is also referred to as the under bump metal plating (UBM). The actual circular bond pads to which the bump is finally soldered are defined by the solder metal plating, since the solder only adheres there. The soldering of the bumps is performed in a reflow process, in which the solder is caused to melt.

Sufficient mechanical stability of all bump connections is very important, since the functionality of the component would be destroyed by a single poor electrical bump connection. The volume of the bumps and the dimensions of the solder metal plating are dimensioned in such a way that the entire component withstands the maximum thermal and mechanical loads required by the client. The area of the solder metal plating per bump is thus subject to specific quality requirements and may not be made arbitrarily small. Further requirements result as boundary conditions from the manufacturing process, such as a minimum interval between the chip edge and a component structure or a safety interval between the solder metal plating and the acoustically active component structures.

FIG. 1 shows a known SAW filter. The size of the acoustic tracks is determined in this case by, among other things, the frequency and impedance positions of the SAW component. It is clear from the figure that, in addition to the acoustic tracks, the busbars, bond pads, and free chip regions also contribute to the overall chip size. The chip size also determines the size of the housing.

Because of the further miniaturization of electrical devices, housings which are small as possible are required. The assumption in this case is that specific requirements in regard to the electrical properties of the components are also to be fulfilled. The goal is thus to reduce the chip size through an optimized chip layout and thus further shrink the housing and/or finished parts with unchanged or even improved filter performance.

This object is achieved according to the present invention by a component according to Claim 1. Advantageous embodiments of the present invention result from the subclaims.

Known solder metal platings on the chip and on the carrier and/or housing have been shaped circularly up to this point. A barrel-shaped connection, like a sphere having two cut-off poles, forms through the melting of the solder bumps with the two circular areas of the solder metal platings. This results in the same space being required for the bump connections in the x and y directions on the chip.

The present invention now suggests a bump connection defined via the solder metal plating, in which the dimension along a first axis is significantly smaller than that along a second axis, which particularly runs transversely thereto. Components according to the present invention have a dimension along a second axis which exceeds the dimension along the first axis by more than 30%, for example, by 30 to 80%. The shape and/or the cross-section of the solder metal plating is then, for example, ellipsoidal and/or a type of flattened or oblong circle, which has linear sections parallel to one another.

A more compact arrangement of the structures on the surface of the substrate results from the different dimensions of the solder metal plating on different axes, so that less substrate surface is required and therefore a smaller substrate is possible.

Since the solder bump is only soldered on the solderable solder metal plating provided for this purpose, it is forced into the shape of the solder metal plating during the reflow process. Independently of the area of the contact pad on the substrate, which is typically larger, the size and shape of the solder metal plating is solely responsible for the shape of the bump. The solder metal plating may additionally be applied to the normal metal plating, comprising aluminum, for example, e.g., as a multilayered thin metal plating having a thin gold layer as the actual solderable surface. For example, layer sequences made of Ti, Pt, and Au or Ti, Ni, and Au are well suitable.

The shape of the non-round solder metal plating is selected in such a way that the area content is equal to the previous circular solder metal plating in order to still fulfill the requirements on the mechanical stability. Depending on the length to width ratio of the ellipsoidal shape, in contrast to the circle, a reduction of the dimension results in the direction of the narrow side of the ellipse. In the most favorable case, the entire chip and/or the substrate may be shrunk precisely by the difference between circular diameter and narrow side of the ellipse in the x or y direction. For specific applications, it may also be advantageous to select a shape deviating from an oval or even an irregular shape for the solder metal plating, in order to better correspond to the space offered on the substrate. For chip area reduction, it may be favorable to design all or only a few of the solder metal platings as non-round according to the present invention.

In an advantageous embodiment of the present invention, the non-round and particularly ellipsoidal solder metal platings do not all have their longer axes aligned identically. With different solder metal platings, the larger dimension then results along different substrate axes. The alignment of the long and narrow sides of the solder metal platings is then performed as a function of the shape of the free substrate surface available.

It is also advantageous to position the solder metal platings between substrate edges and the component structures, the longer dimension of the solder metal platings then advantageously being aligned parallel to the particular substrate edge.

It is also possible to position the non-round solder metal plating between different component structures and align the second longer axis parallel to the neighboring edges of the component structures.

The present invention is applied especially advantageously in SAW filters of the greatly varying types cited at the beginning. In this case, the beveling of reflector structures provides further advantages, in order to at least partially place the necessary solder metal platings in the triangular free areas additionally obtained thereby.

Beveling the reflectors in the region which is furthest from the interdigital transducer assigned to the reflector does not result in worsening of the electrical properties of the SAW filter. A more compact chip layout results, which allows further reduction of the chip area.

The beveling is performed in such a way that a first group of reflector fingers, positioned closer to the assigned interdigital transducer, remains unchanged (equally long), while the reflector fingers of the second group have their length shortened on one or both sides, the length of the reflector fingers falling with increasing distance to the assigned interdigital transducer.

The first group of reflector fingers whose length is unchanged advantageously comprises 20 to 50 reflector fingers.

If the two features "ellipsoidal and/or non-round solder metal plating" and "beveled reflector structures" are combined, a further reduction of the chip area may be achieved in many applications.

The present invention is used especially advantageously in high-frequency components which operate using acoustic waves, in which the acoustic component structures are relatively small because of the relatively low wavelengths. However, with unchanged mechanical requirements on the component, the size of the bump connections is less affected thereby, so that in high-frequency components the proportion of the substrate area claimed by the bump connections is relatively large in relation to components which operate at lower frequency. A relatively greater reduction of the substrate size is thus achieved using the present invention in high-frequency components.

A substrate having a rectangular or generally quadrilateral surface, on which the component structures are oriented parallel to a diagonal of the substrate, may also be advantageous. A solder metal plating may be provided in the corners. This arrangement is especially advantageous if the component structures proximal to the corners cited are beveled reflectors, whose beveled edges are then approximated by the corner angle of the substrate. In the ideal case, the beveled edges are aligned parallel or approximately parallel to at least one substrate edge. The component structures may thus be shifted further into the corner and save further substrate surface.

A piezoelectric substrate, particularly piezoelectric substrates made of $LiTaO_3$ or $LiNbO_3$, is advantageously used. Silicon may also be used as a substrate for BAW components.

Since most crystalline piezoelectric substrates often have different thermal expansion coefficients along different crystal axes, very good thermal tailoring of substrate and carrier is practically not possible if not the same material is used for the carrier as for the substrate, which is typically not possible for reasons of cost, however. According to the present invention, it is now possible to match the carrier to the expansion coefficient along one axis of the substrate. If bump connections according to the present invention are used, minimized thermal tensions are obtained if the solder metal platings are implemented as oblong and ellipsoidal, for example, and are positioned on the substrate one behind another and aligned parallel to this substrate axis, to whose expansion coefficients the carrier material is thermally matched. Furthermore, it is advantageous if some solder metal platings which are oriented in the direction of the non-matched axis are positioned in the middle of the component, i.e., on the neutral line in relation to the thermal expansion. Using both measures, a lower mechanical load of the bump connections is obtained thermally and the bump size may be reduced without the mechanical stability of the bump connections suffering under thermal load. A smaller bump is implemented by a smaller solder metal plating and results in a gain in additional substrate area and/or allows shrinking of the substrate. However, vice versa, it is also possible to select a carrier material which, under the listed aspects in regard to minimal thermomechanical load of the bump connections, is matched to a given layout and/or to the positioning of the solder metal platings on the substrate surface.

In the following, the present invention will be explained in greater detail on the basis of preferred embodiments with reference to FIGS. 1 through 24. The figures are only schematic and are not bound to scale. In particular, the number of interdigital transducers and reflector fingers has been reduced for better visibility.

DESCRIPTION OF THE DRAWINGS

FIG. 7 shows a filter in which the number of solder metal platings is reduced in relation to the embodiment in FIG. 6

FIG. 8 shows the filter from FIG. 7, in which additional reflectors are beveled

FIG. 11 shows a filter in which a DMS track is connected in series to resonators at its input and output FIG. 12 shows a filter similar to FIG. 11, in which additional reflectors are beveled FIG. 13 shows a further filter, in which a DMS track is connected in series to resonators at its input and output FIG. 14 shows a filter similar to FIG. 13, in which additional reflectors are beveled FIG. 19 shows a DMS filter having a series resonator FIG. 20 shows a filter similar to FIG. 19, in which additional reflectors are beveled

FIGS. 2 through 23 show the arrangement of the component structures of embodiments according to the present invention in a schematic top view of the surface of the substrate.

DETAILED DESCRIPTION

Figure 1:
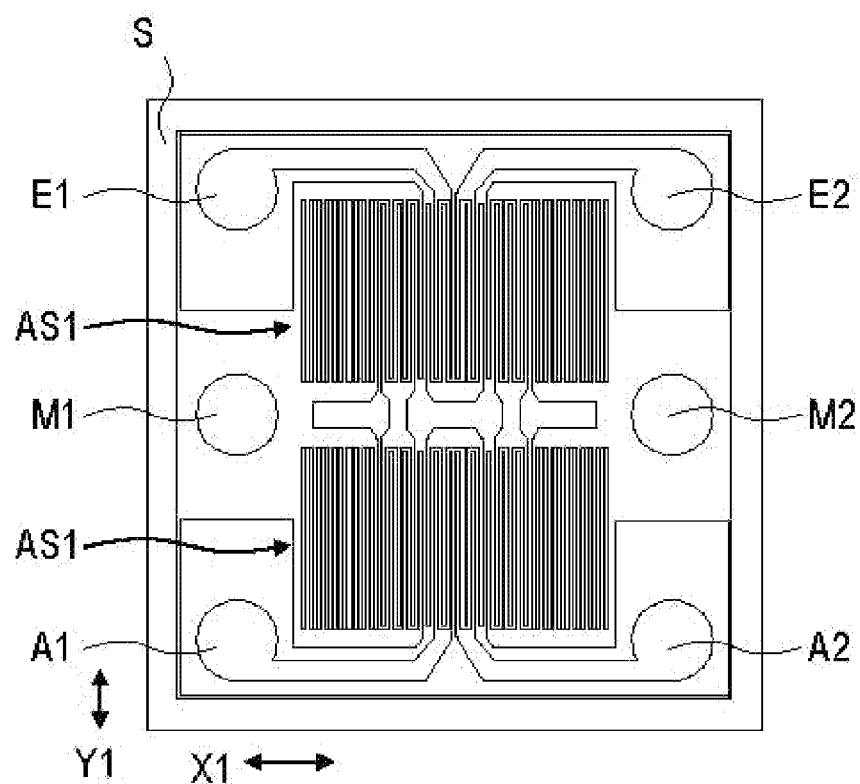
FIG. 1 shows a known 2-track DMS filter having round solder metal platings

FIG. 1 shows, in the same top view, a known DMS filter for symmetrical/symmetrical operation without impedance transformation. Two acoustic tracks AS1, AS2, which in turn comprise the middle interdigital transducer, two external interdigital transducers, and a reflector at each end, are positioned on a piezoelectric substrate S. The busbars, which each point outward, of the two middle interdigital transducers are split and connected to a solder metal plating—round in this case—in each case. In each case the interdigital fingers of the inwardly directed polarity of the middle interdigital transducer each are connected to a single busbar respectively. This busbar is electrically "floating" and therefore not expanded to the size of a bond pad. The external interdigital transducers are connected on one side to the ground bond pad of the neighboring reflector, on the other side, the busbar is electrically connected to the busbar of the corresponding interdigital transducer from the second track. The connection pads are also electrically "floating". The solder metal plating for the input is identified by E1 and E2, that one for the output by A1 and A2.

In the figure, only the solderable areas of the component structures are shown as the solder metal plating. The solder metal plating may be obtained through structured application onto the bond pad or through structured covering of a large-area metal plating, for example, through covering with a solder resist. This allows the use of solderable metal platings for the component structures. The area of the bond pad located under the solder metal plating partially terminates with the solder metal plating, but also has an extension toward the component structures and is connected here to the corresponding busbar. If space allows it, the bond pad may also be significantly larger than the solder metal plating. All solder metal platings are positioned on two diametrically opposite edges of the substrate in two parallel rows. The solder metal platings M1 and M2 for the ground connection are each positioned between the solder metal platings for input and output E1 and A1 or E2 and A2. All bond pads for the ground connection are connected to a thin electrically conductive frame in order to harmlessly dissipate pyroelectrically generated charge carriers to ground. The substrate has a dimension x1 parallel to the acoustic tracks and a dimension y1 perpendicular thereto.

Figure 2:
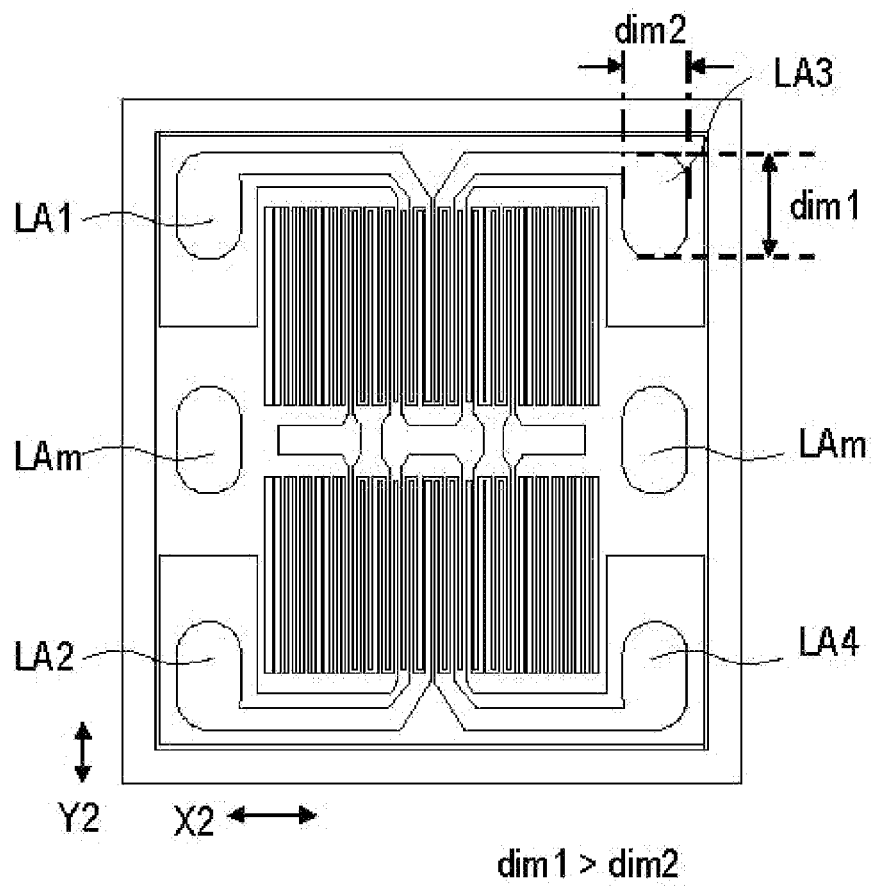
FIG. 2 shows a 2-track DMS filter according to the present invention having oval solder metal platings

FIG. 2 shows a first embodiment according to the present invention of a component implemented as a SAW DMS filter. The DMS filter is constructed like the filter described in FIG.

1, but with solder metal platings different therefrom. The chip dimension in the x direction is determined by the length of the acoustic tracks and the width of the bond pads. In order to minimize the chip dimension in the x direction, all solder metal platings LA are implemented as ellipsoidal and positioned in such a way that there is a smaller dimension in the x direction than in the y direction. The area of the solder metal platings may remain unchanged in relation to known filters and correspond to that of the filter illustrated in FIG. 1, for example. An originally round solder metal plating of, for example, 125 µm diameter may thus become a non-round ellipsoidal area of 90 µm×155 µm. In relation to a known filter, a reduction of the dimension x2 of the layout in the x direction of 2 (125 µm−90 µm)=70 µm thus results. The dimension of the layout remains unchanged in the y direction. In this case, x2<x1 and y2=y1.

Overall, the layout is symmetrical in relation to the y axis, so that the electrical properties are not impaired in symmetrical/symmetrical operation. The illustrated frame-shaped connection line R from one ground bond pad having the solder metal plating $LA_m$ to the other may also be left out if other protective measures are used, the chip area additionally shrinking. This also applies for all further embodiments.

Figure 3:
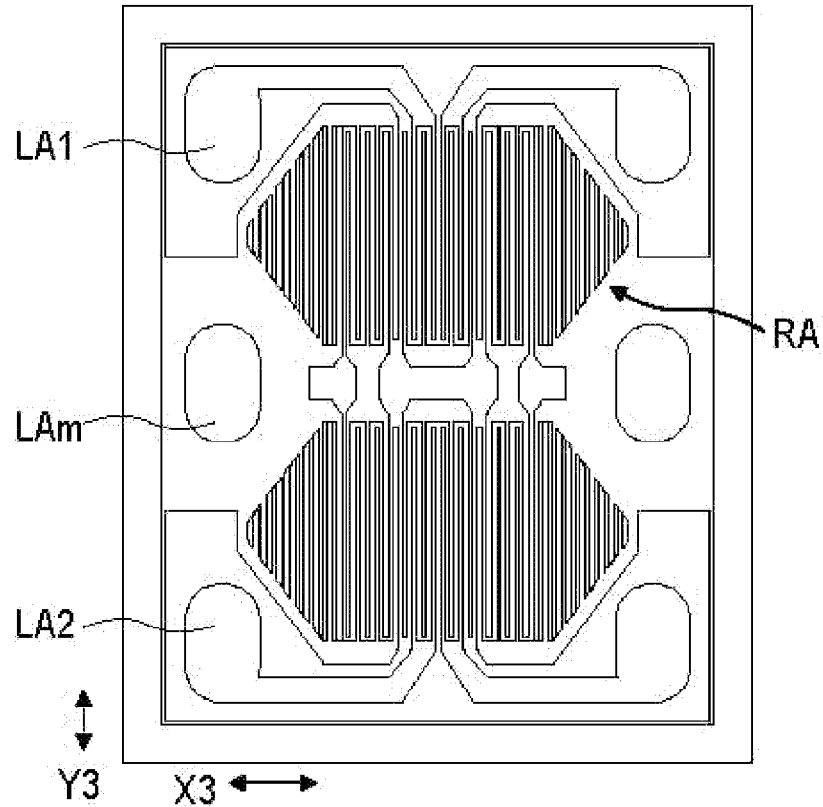
FIG. 3 shows a 2-track DMS filter having additional beveled reflectors

FIG. 3 shows a second embodiment of the present invention, which comprises a modified chip layout for a DMS filter for symmetrical/symmetrical operation without impedance transformation. In addition to the arrangement of the first embodiment, the reflectors of the two acoustic tracks are now also beveled. In spite of maintaining the identical predefined safety interval between the acoustic structures and the bond pads as in the first embodiment, a further reduction of the chip dimension x3 in the x direction results, since the bond pads and therefore also the solder metal platings may be shifted into the region of the triangular bevels RA, which become free. The beveling is performed here in such a way that the external ends of all reflectors are symmetrically tapered to a point.

Figure 4:
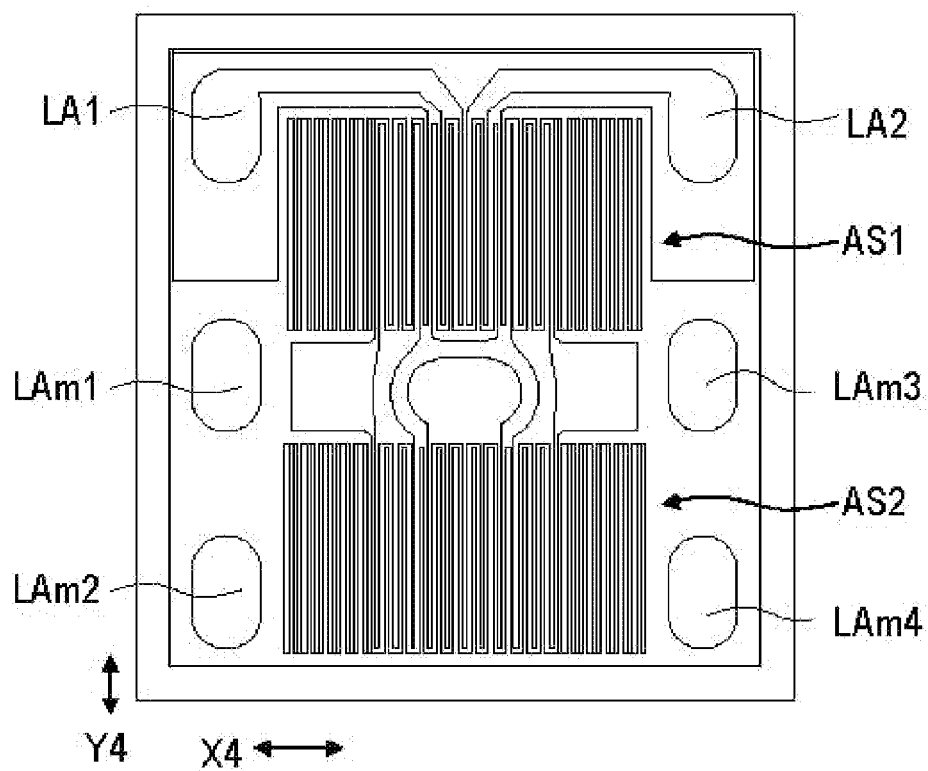
FIG. 4 shows a filter in which the solder metal platings are positioned between the tracks

FIG. 4 shows a third embodiment according to the present invention. This comprises a modified chip layout for a DMS filter for asymmetrical/symmetrical operation with impedance transformation. The DMS filter comprises two acoustic tracks, which in turn comprise the middle interdigital transducer, the two external interdigital transducers, and a reflector at each end. The middle interdigital transducer of the first track AS1 is split at the external busbar and connected to two different busbars. The symmetrical operation thus results. The interdigital fingers of the inwardly directed polarity of the middle interdigital transducer are connected to a single busbar. This busbar is electrically "floating" and therefore not expanded to the size of a bond pad.

The external interdigital transducers are connected on one side to the ground bond pad of the neighboring reflector, and on the other side the busbar is electrically connected to the busbar of the corresponding interdigital transducer from the second track AS2. The connection pads are also electrically "floating".

In the middle interdigital transducer of the second acoustic track AS2, the electrically insulated potential (input) are connected to the bond pad expanded in the middle and connected to a non-round solder metal plating LA. The busbar of the associated interdigital finger of the other polarity is connected with the busbar of the external interdigital transducer and neighboring reflectors to form a single busbar and guided left and right to the ground bond pad and the corresponding solder metal platings $LA_m1$ through $LA_m4$.

In order to obtain the smallest possible chip dimension in the y direction, the solder metal plating lying between the acoustic tracks, and the associated bond pad are flattened in the y direction and the acoustic tracks are shifted closer to the bond pad. All remaining bond pads are placed laterally next to the tracks. The solder metal platings $LA_m2$ and $LA_m4$ and/or the ground bond pads of the second acoustic track AS2 may be implemented as separate bond pads as in FIG. 4, or connected to the first track.

The chip dimension x4 in the x direction is thus determined by the length of the acoustic tracks and the width of the bond pads and/or the solder metal platings, which is reduced according to the present invention. For this purpose, the ellipsoidal bond pads are positioned in such a way that the smaller dimension is in the x direction.

Overall, the layout is symmetrical in relation to the y axis, so that the electrical properties are not impaired in asymmetrical/symmetrical operation. A reduction of the chip size in the x and y directions results in relation to a comparable embodiment using typical circular bond pads.

Figure 5:
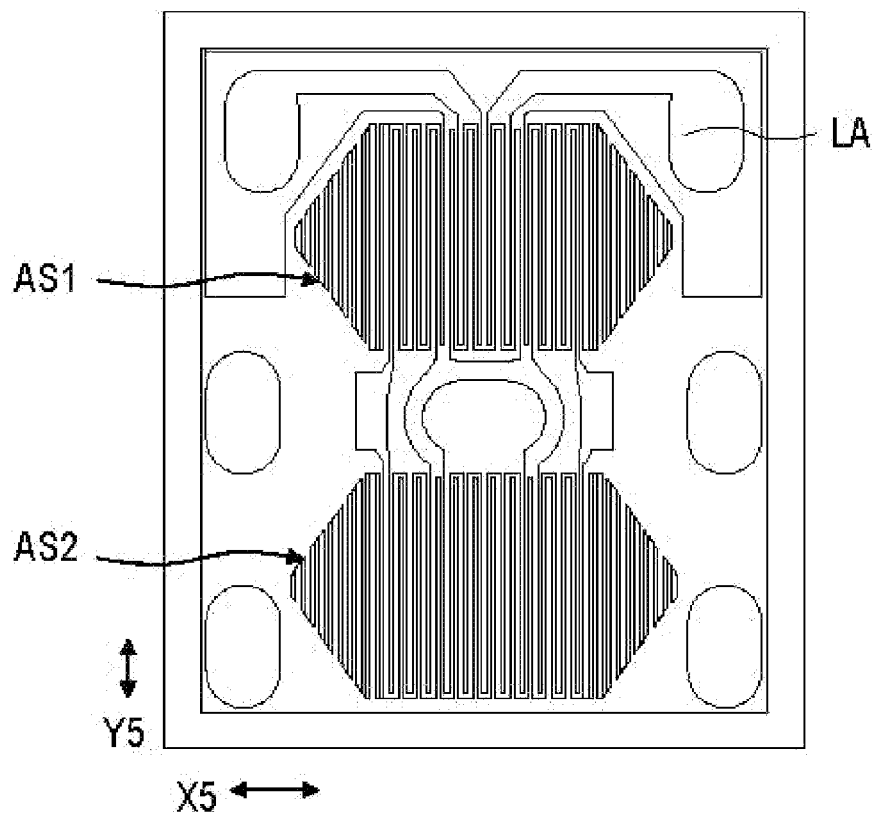
FIG. 5 shows the filter from FIG. 4, in which additional reflectors are beveled

FIG. 5 shows a fourth embodiment according to the present invention. It comprises a modified chip layout for a DMS filter for asymmetrical/symmetrical operation with impedance transformation. In addition to the arrangement of the third embodiment (FIG. 4), the reflectors of the two acoustic tracks are now also beveled similarly to FIG. 3. In spite of maintaining an unchanged predefined safety interval between the acoustic structures and bond pads as in the third embodiment, a further reduction of the chip size x5 in the x direction results. The bond pads and therefore also the solder metal platings may be shifted inward into the region of the triangular bevels, which become free, for this purpose.

Figure 6:
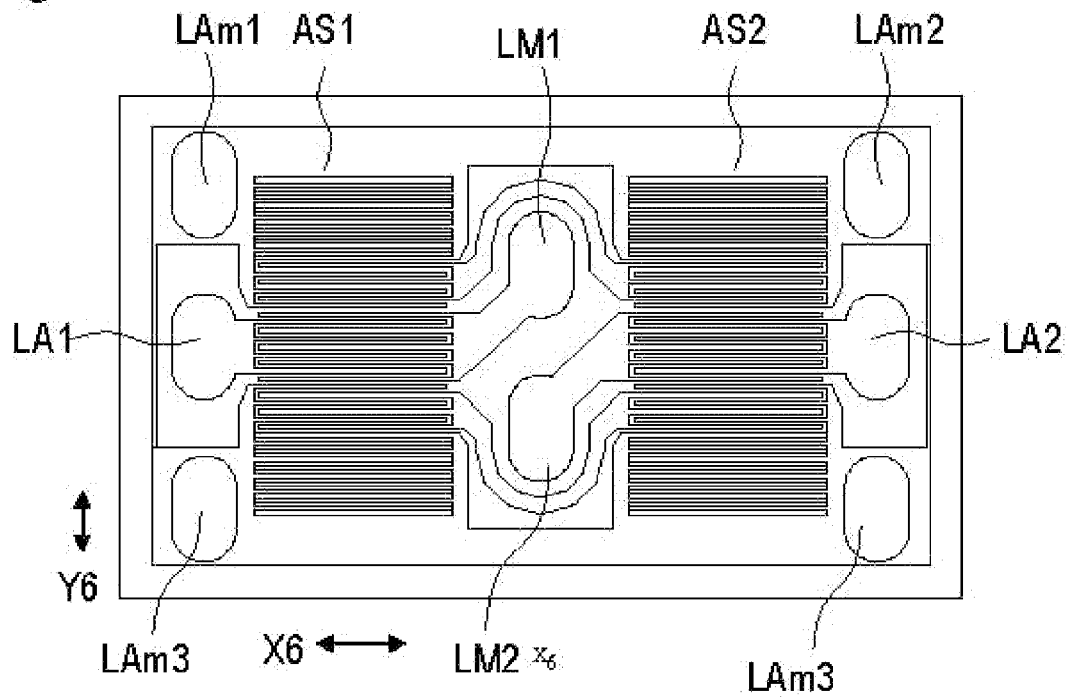
FIG. 6 shows a filter in which all solder metal platings are positioned in rows parallel to one another

FIG. 6 shows a fifth embodiment according to the present invention of a modified chip layout for a DMS filter for asymmetrical/asymmetrical or asymmetrical/symmetrical operation without impedance transformation. The DMS filter comprises two acoustic tracks AS1, AS2, which in turn comprise the middle interdigital transducer, the two external interdigital transducers, and a reflector at each end. The bond pads of the middle interdigital transducer are electrically insulated. The external interdigital transducers are connected on one side to the ground bond pads of the neighboring reflector, and on the other side to the busbar of the corresponding interdigital transducer from the second track. The connection pad is electrically "floating" in relation to the electric potentials of the middle interdigital transducer.

In order to obtain the smallest possible chip dimension x6 in the x direction, all solder metal platings LA, LM are implemented as ellipsoidal and positioned in such a way that the smaller dimension is in the x direction. The acoustic tracks are shifted close to the bond pads and/or the solder metal platings. In the event of unfavorable positioning of the bond pads, this may result in an expansion of the chip in the x direction.

This may be more than compensated for by the reduction of the number of four external ground pads to two ground pads $LA_m1$, $LA_m2$ illustrated in FIG. 7, without having to accept a disadvantage in the electrical properties of the SAW filter.

Overall, the layout of FIG. 6 is symmetrical in the x and y directions (and/or point-symmetrical for two mass bumps). A reduction of the chip size x6 in the x direction (and/or also the dimension y6 in the y direction) results in relation to the embodiment having circular solder metal platings. FIG. 7 is point-symmetrical.

FIG. 8 shows a modified chip layout for a DMS filter for asymmetrical/asymmetrical or asymmetrical/symmetrical operation without impedance transformation as a sixth embodiment. In addition to the arrangement of the fifth embodiment shown in FIG. 6, the reflectors of the two acoustic tracks are now also beveled. A further reduction of the chip size in the y direction results if the external four mass bond pads and/or the associated ellipsoidal solder metal platings $LA_m1$ through $LA_m4$ are now aligned in the x direction, in contrast to FIG. 6. The bond pads may be shifted into the region of the triangular bevels, which become free, so that they do not negatively influence the chip dimension in the x direction.

Figure 9:
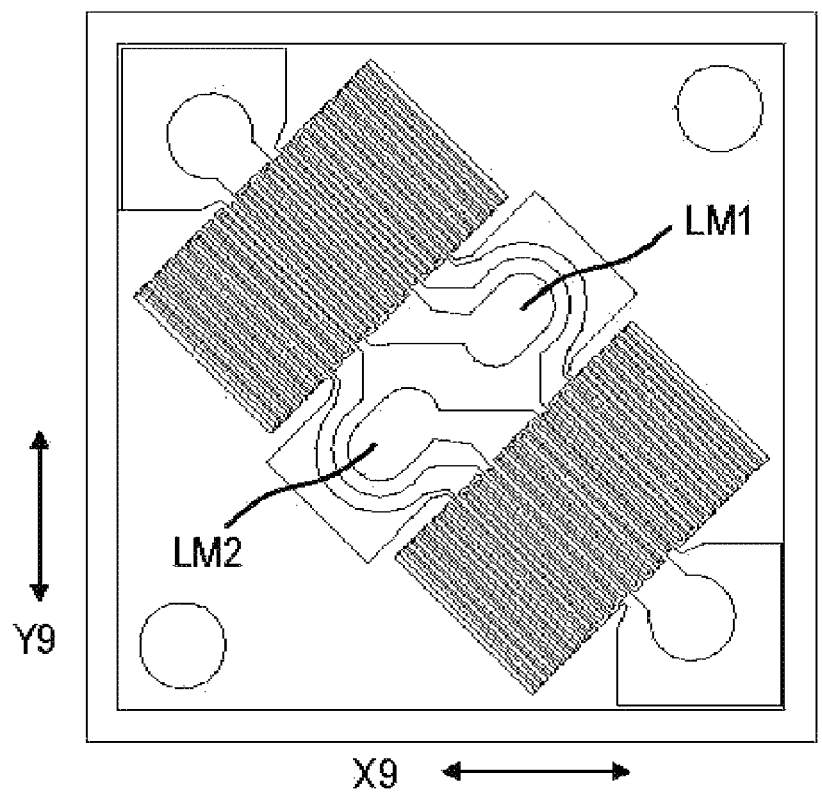
FIG. 9 shows a filter in which the acoustic tracks are positioned parallel to a diagonal of the substrate

FIG. 9 shows a modified chip layout for a DMS filter for asymmetrical/asymmetrical or asymmetrical/symmetrical operation without impedance transformation as a seventh embodiment. The DMS filter comprises two acoustic tracks, which in turn comprise the middle interdigital transducer, the two external interdigital transducers, and a reflector at each end. The bond pads of the middle interdigital transducer are electrically insulated. The external interdigital transducers are connected on one side to the ground bond pad of the neighboring reflector, and on the other side the busbar is electrically connected to the busbar of the corresponding interdigital transducer from the second track. The connection pad is electrically "floating" in relation to the electrical potentials of the middle interdigital transducer.

In contrast to the embodiments up to this point, the acoustic tracks are positioned approximately at a 45° angle to the chip edges, i.e., oriented parallel to the diagonals of the substrate S. In order to obtain the smallest possible chip dimension in the x and y directions, the two middle bond pads and/or solder metal platings LM1, LM2 are flattened in such a way that the two acoustic tracks may be shifted closer together. Overall, the layout is point-symmetrical. A reduction of the chip size in the x and y direction results in relation to the embodiment having circular solder metal platings.

Figure 10:
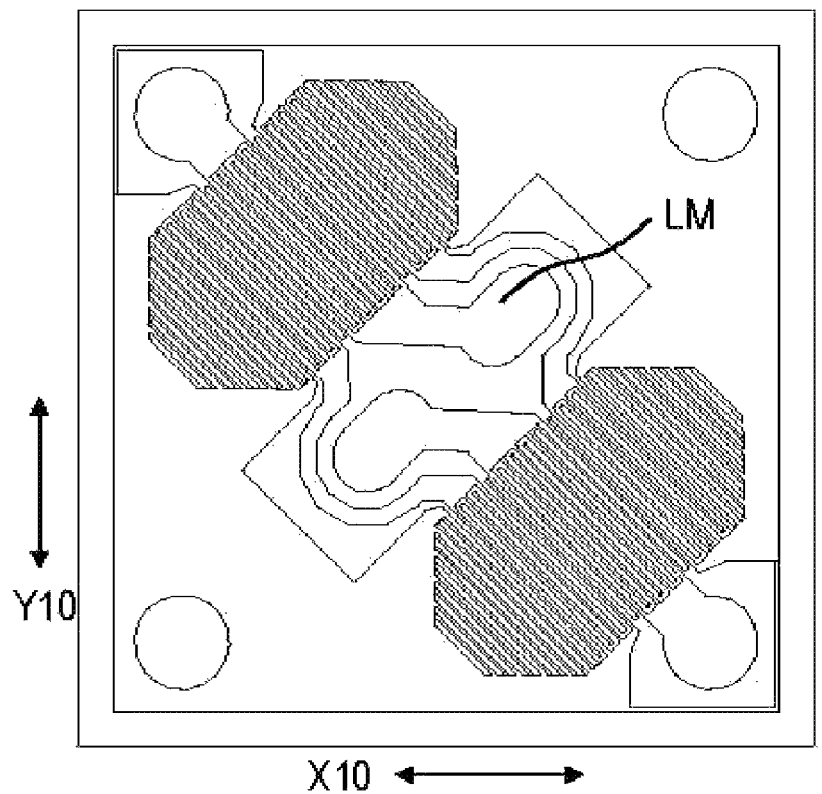
FIG. 10 shows a filter similar to FIG. 9, in which additional reflectors are beveled

FIG. 10 shows a modified chip layout for a DMS filter for asymmetrical/asymmetrical or asymmetrical/symmetrical operation without impedance transformation as the eighth embodiment according to the present invention. In addition to the arrangement of the seventh embodiment (FIG. 9), the reflectors of the two acoustic tracks are now also beveled in such a way that the beveled edges run parallel to the chip edges (substrate edges). This allows the layout to be shifted further into the corners. In spite of maintaining the identical predefined safety interval between the acoustic structures and bond pads as in the seventh embodiment, a further reduction of the chip size in the x and y directions results, since the external corners of the acoustic structures decisively determine the external delimitation of the chip.

FIG. 11 shows a modified chip layout for a DMS filter having additional resonators for symmetrical/symmetrical operation without impedance transformation as the ninth embodiment. The SAW filter comprises a DMS track having four series resonators. Each two series resonators are combined into one acoustic track (multiport resonator), since the two interdigital transducers in the acoustic propagation direction are laid directly next to one another and are only externally embraced by reflectors. This is possible since the frequency position of these series resonators is identical or at least very similar.

There is a multiport resonator at each of the symmetrical gates LA1, LA2; LA3, LA4, an insulated bond pad being electrically connected to one half of each multiport resonator. The DMS track is located between the two multiport resonators. The DMS track comprises a middle interdigital transducer, the two external interdigital transducers, and a reflector at each end. The interdigital fingers of the middle interdigital transducer are split on one side and their busbars are each electrically connected to an interdigital transducer of the second multiport resonator. On the other side, they connected to a single busbar. This busbar is electrically "floating" and therefore not expanded to the size of a bond pad.

The external interdigital transducers are connected on one side to the ground bond pad of the neighboring reflector, and on the other side the busbar is electrically connected to the busbar of the corresponding interdigital transducer of the first multiport resonator. A series circuit made of resonator, DMS track, and further resonator thus results from the symmetrical input gate LA1, LA2 to the symmetrical output gate LA3, LA4.

In order to obtain the smallest possible chip dimension y11 in the y direction, the acoustic tracks are shifted closer together and all bond pads are placed laterally next to the tracks. The chip dimension in the x direction is thus determined by the length of the acoustic tracks and the width of the bond pad. The ellipsoidal solder metal platings for the external bond pads are positioned in such a way that the smaller dimension is in the x direction.

Overall, the layout is symmetrical in relation to the y axis, so that the electrical properties are not impaired in symmetrical/symmetrical operation.

FIG. 12 shows a modified chip layout for a DMS filter having additional resonators for symmetrical/symmetrical operation without impedance transformation as the tenth embodiment. In addition to the arrangement of the ninth embodiment, the reflectors of the additional resonators are now also beveled. In spite of maintaining the identical predefined safety interval between the acoustic structures and bond pads as in the ninth embodiment, a further reduction of the chip size in the x direction results. The bond pads and the associated solder metal platings may be shifted inward into the region of the triangular bevels, which become free, for this purpose.

FIG. 13 shows a modified chip layout for a DMS filter having additional resonators for asymmetrical/symmetrical operation with impedance transformation as the eleventh embodiment. The SAW filter comprises a DMS track having three series resonators. Two of the three series resonators are combined into an acoustic track AS1 (multiport resonator), in that the two interdigital transducers are laid directly next to one another in the acoustic propagation direction and only externally framed by reflectors. This is possible since the frequency position of these series resonators is identical or at least very similar.

The multiport resonator is connected to the symmetrical gate LA1, LA2, one insulated bond pad being electrically connected to each half of the multiport resonator. The third series resonator is located at the asymmetrical gate and is electrically connected to the insulated bond pad. The DMS track is positioned between the multiport resonator and the third series resonator.

The DMS track comprises a middle interdigital transducer, the two external interdigital transducers, and a reflector at each end. The interdigital fingers of the middle interdigital transducer are divided on the side of the symmetrical gate and their busbars are each electrically connected to an interdigital transducer of the multiport resonator. On the other side, they are connected to a single busbar. This busbar is electrically "floating" and therefore not expanded to the size of a bond pad.

The external interdigital transducers are connected on one side to the ground bond pad of the neighboring reflector, and on the other side, the busbar is electrically connected to the busbar of the third series resonator. A series circuit made of resonator, DMS track, and further resonator thus results from the asymmetrical gate to the symmetrical gate LA1, LA2.

In order to obtain the smallest possible chip dimension in the y direction, the solder metal plating for the bond pad is flattened at the asymmetrical gate in the y direction and the acoustic tracks are shifted close together. All remaining solder metal platings are also flattened and placed laterally next to the tracks, with the longer dimension in the y direction parallel to the substrate edges. Depending on the application, two or even four ground bond pads find space. An arrangement symmetrical to the y axis results.

Overall, the layout is symmetrical in relation to the y axis, so that the electrical properties are not impaired in asymmetrical/symmetrical operation.

FIG. 14 shows a modified chip layout for a DMS filter having additional resonators for asymmetrical/symmetrical operation with impedance transformation as the twelfth embodiment according to the present invention. In addition to the arrangement of the eleventh embodiment, the reflectors of the additional resonators are now also beveled. In spite of maintaining the identical predefined safety interval between the acoustic structures and bond pads as in the eleventh embodiment, a further reduction of the chip size in the x direction results. The bond pads and solder metal platings may be shifted inward into the region of the triangular bevels, which become free.

Figure 15:
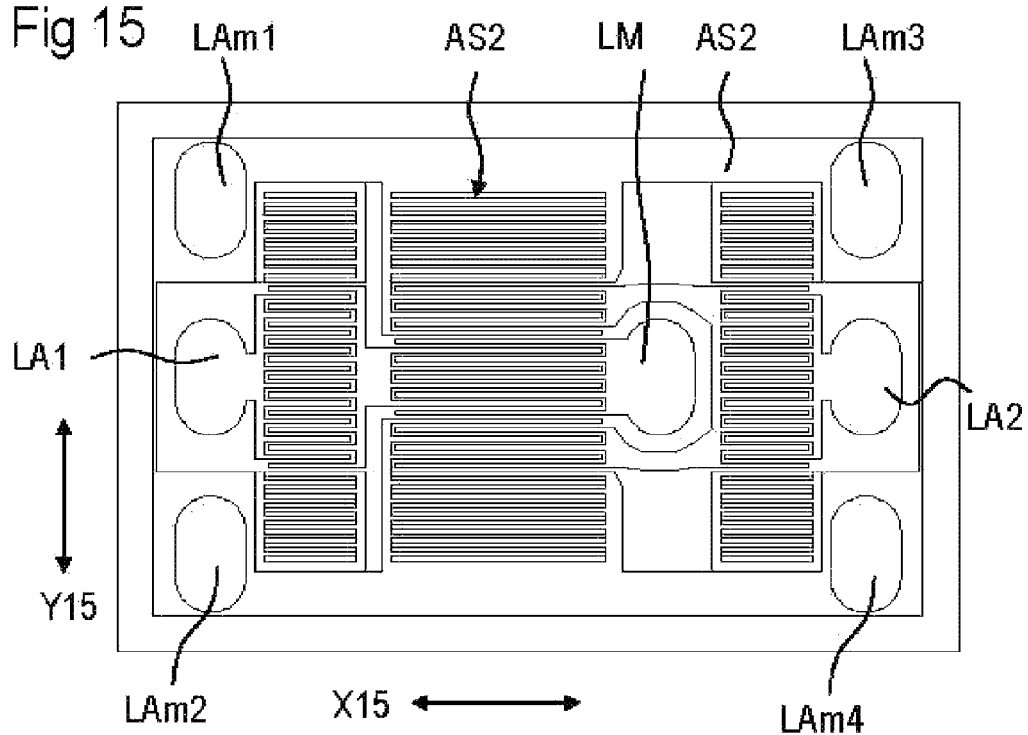
FIG. 15 shows a DMS filter having two series resonators

FIG. 15 shows a modified chip layout for a DMS filter having additional resonators for asymmetrical/asymmetrical operation without impedance transformation as the thirteenth embodiment according to the present invention.

The SAW filter has a DMS track as the middle acoustic track AS2, which is wired using two series resonators into the external acoustic tracks AS1 and AS3, and forms an asymmetrical gate in each case there, an insulated bond pad being electrically connected to a busbar of the series resonator in each case.

The DMS track comprises a middle interdigital transducer, the two external interdigital transducers, and a reflector at each end. The first busbar of the middle interdigital transducer is connected to the first series resonator and the second busbar is expanded into an insulated bond pad.

The external interdigital transducers are connected on one side to the ground bond pad of the neighboring reflector, and on the other side the two busbars are combined and electrically connected to the second series resonator. A series circuit made of resonator, DMS track, and further resonator thus results from the asymmetrical input gate to the asymmetrical output gate.

In order to obtain the smallest possible chip dimension in the x direction, the ellipsoidal solder metal platings are positioned on the bond pads in such a way that they have the smaller dimension in the x direction and the acoustic tracks are shifted close together. The ground bond pads $LA_m1$ through $LA_m4$ are placed next to the insulated bond pads LA1, LA2 on the asymmetrical input or output gate, respectively. Depending on the application, two or even four ground bond pads are placed.

If the variation positioned symmetrically to the x axis having four ground connections is used, the ground pads may, depending on the application, project past the length of the acoustic tracks. In this case, the reduction to two ground pads, as in the variation to the embodiment 5 (FIG. 7), is more advantageous, in order to keep the chip dimension in the y direction smaller. A reduction of the chip size in the x direction results in relation to a corresponding embodiment having circular solder metal plating.

Figure 16:
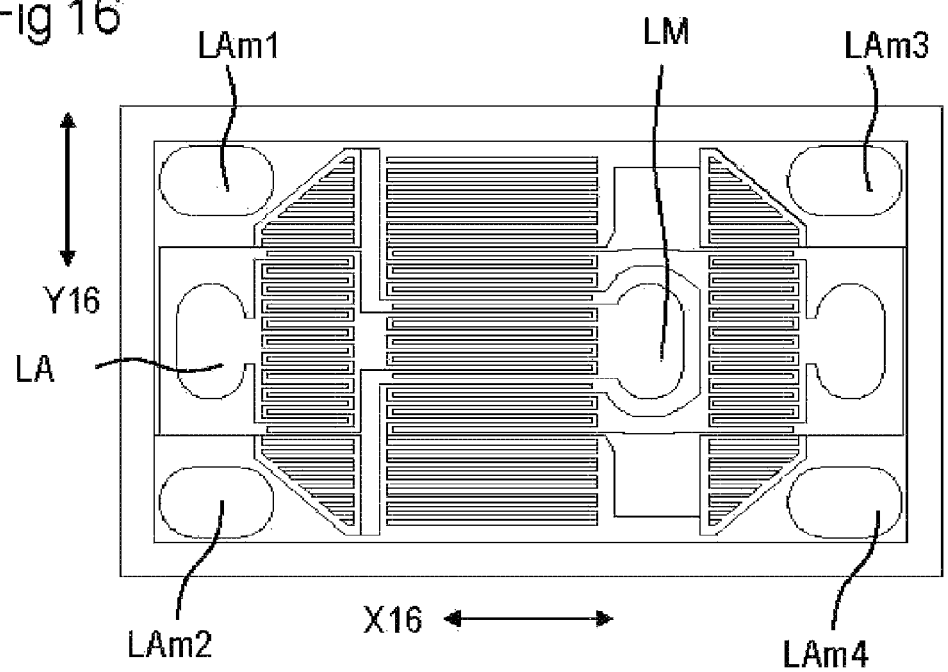
FIG. 16 shows a DMS filter having a DMS track having two series resonators and impedance transformation

FIG. 16 shows a modified chip layout for a DMS filter having additional resonators for asymmetrical/asymmetrical operation with impedance transformation as the fourteenth embodiment. In addition to the arrangement of the thirteenth embodiment, the reflectors of the additional resonators are now also beveled. In spite of maintaining the identical predefined safety interval between the acoustic structures and bond pads as in the thirteenth embodiment, a reduction of the chip size in the y direction now results, if the bond pads would project past the length of the acoustic tracks. The solder metal platings $LA_m1$ through $LA_m4$ may be rotated by 90° and shifted into the region of the triangular bevels, which become free.

Figure 17:
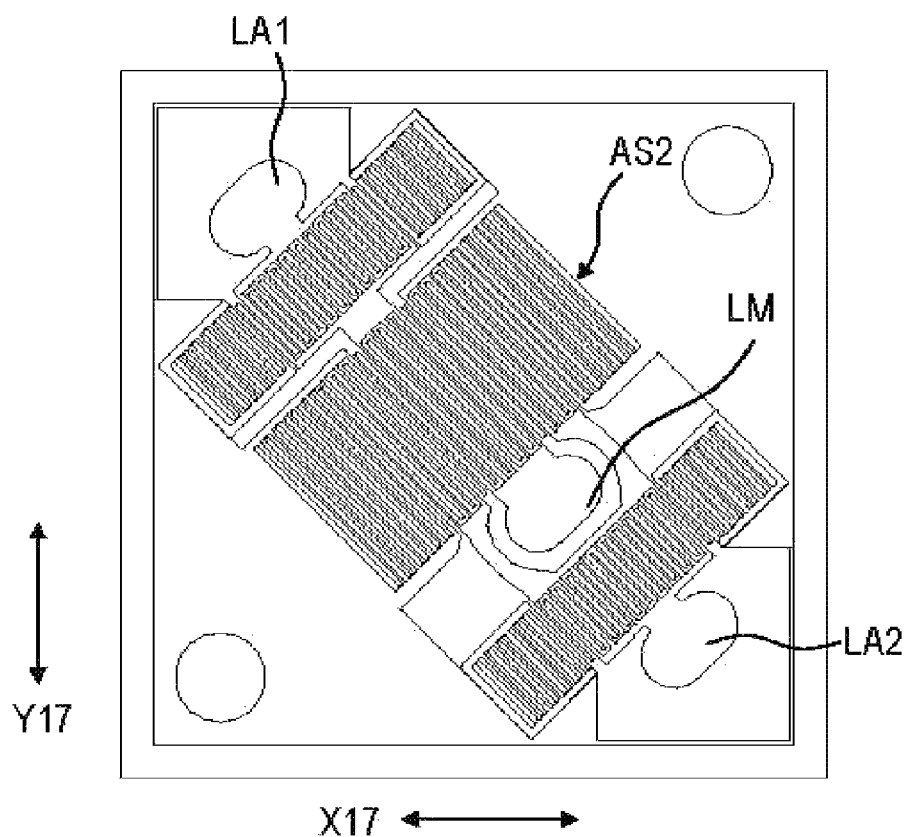
FIG. 17 shows a diagonally aligned DMS filter having two series resonators

FIG. 17 shows a modified chip layout for a DMS filter having additional resonators for asymmetrical/asymmetrical operation without impedance transformation as the fifteenth embodiment.

A series resonator is applied to each of the two asymmetrical gates, an insulated bond pad LA being electrically connected to each busbar of the series resonators. A DMS track is positioned between the series resonators as the middle acoustic track AS2.

The DMS track ASW2 comprises a middle interdigital transducer, the two external interdigital transducers, and a reflector at each end. The first busbar of the middle interdigital transducer is connected to the first series resonator. The second busbar is expanded into an insulated bond pad and/or the associated solder metal plating LM.

The external interdigital transducers are connected on one side to the ground bond pads of the neighboring reflector, and on the other side the busbars are combined and electrically connected to the second series resonator. A series circuit made of resonator, DMS track, and further resonator thus results from the asymmetrical input gate to the asymmetrical output gate.

In contrast to the embodiment 13, the acoustic tracks are positioned at approximately a 45° angle to the chip edges. The signal flow of the SAW component from the input to the output is diagonal from the input bond pad LA1 to the output bond pad LA2. In order to obtain the smallest possible chip dimension in the x and y directions, the solder metal platings are flattened on the insulated bond pads in such a way that the acoustic tracks may be shifted close together. Depending on the application, two or even four ground bond pads may be used, flattening is possible but usually not necessary.

Overall, the layout is axially symmetrical in relation to the diagonal from the input to the output. A reduction of the chip size in the x and y directions results in relation to a corresponding embodiment having circular solder metal platings.

Figure 18:
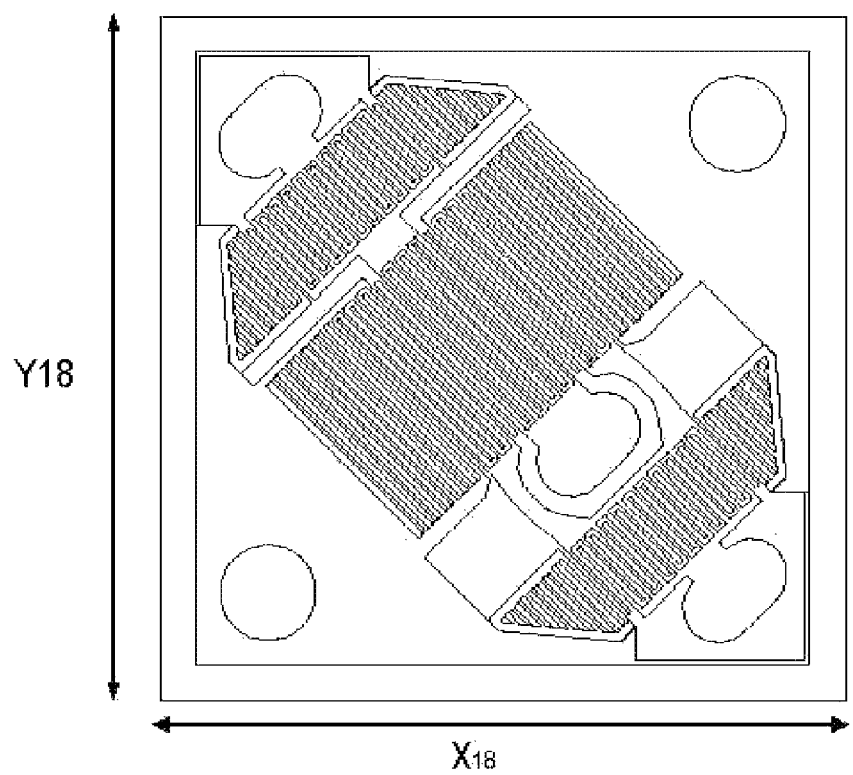
FIG. 18 shows a filter similar to FIG. 17, in which additional reflectors are beveled

FIG. 18 shows a modified chip layout for a DMS filter having additional resonators for asymmetrical/asymmetrical operation without impedance transformation as the sixteenth embodiment. In addition to the arrangement of the fifteenth embodiment, the reflectors of the two additional resonators are now also beveled. In spite of maintaining the identical predefined safety interval between the acoustic structures and bond pads as in the fifteenth embodiment, a further reduction of the chip size in the x and y directions results, since the external corners of the acoustic structures decisively determine the external delimitation of the chip.

FIG. 19 shows a modified chip layout for a DMS filter having additional resonators for asymmetrical/symmetrical operation without impedance transformation as the seventeenth embodiment. The SAW filter comprises a DMS track having a series resonator.

The series resonator is applied to the asymmetrical gate illustrated on the right, the insulated bond pad and/or the corresponding solder metal plating LA1 being electrically connected to the busbar of the series resonator.

The DMS track comprises a middle interdigital transducer, the two external interdigital transducers, and a reflector at each end. The two busbars of the middle interdigital transducer are each expanded into an insulated bond pad LA2, LM and together form the symmetrical gate. The external interdigital transducers are connected on one side to the ground bond pad $LA_m$ of the neighboring reflector, and on the other side the two busbars are combined and electrically connected to the series resonator. A series circuit made of resonator and DMS track thus results from the asymmetrical gate to the symmetrical gate.

In order to obtain the smallest possible chip dimension in the x direction, the bond pads and/or the associated solder metal platings are flattened in the x direction and the acoustic tracks are shifted close together. The solder metal platings for the ground bond pads $LA_m1$ through $LA_m4$ are located next to the insulated bond pads LA1, LA2 on the input or output gate, respectively. Depending on application, two or even four round bond pads are located.

The chip dimension in the y direction is determined by the length of the acoustic tracks. If the variation positioned symmetrically to the x axis having four mass bumps is used, depending on the application, it may project past the length of the acoustic tracks. In this case, the reduction to two bumps as in the variation to the embodiment 5 (FIG. 7) is more advantageous in order to keep the chip dimension in the y direction small. A reduction of the chip size in the x direction results in relation to a corresponding embodiment having circular solder metal platings.

FIG. 20 shows a modified chip layout for a DMS filter having additional resonators for asymmetrical/symmetrical operation with impedance transformation as the eighteenth embodiment. In addition to the arrangement of the seventeenth embodiment, the reflectors of the DMS track and the series resonators are also beveled. In spite of maintaining the identical predefined safety interval between the acoustic structures and bond pads as in the seventeenth embodiment, a reduction of the chip size in the y direction now results, if the bond pads previously would have projected past the length of the acoustic tracks. The bond pads and/or ellipsoidal solder metal platings of the ground terminals $LA_m1$ through $LA_m4$ are rotated by 90° and shifted into the region of the triangular bevels, which become free, as shown.

Figure 21:
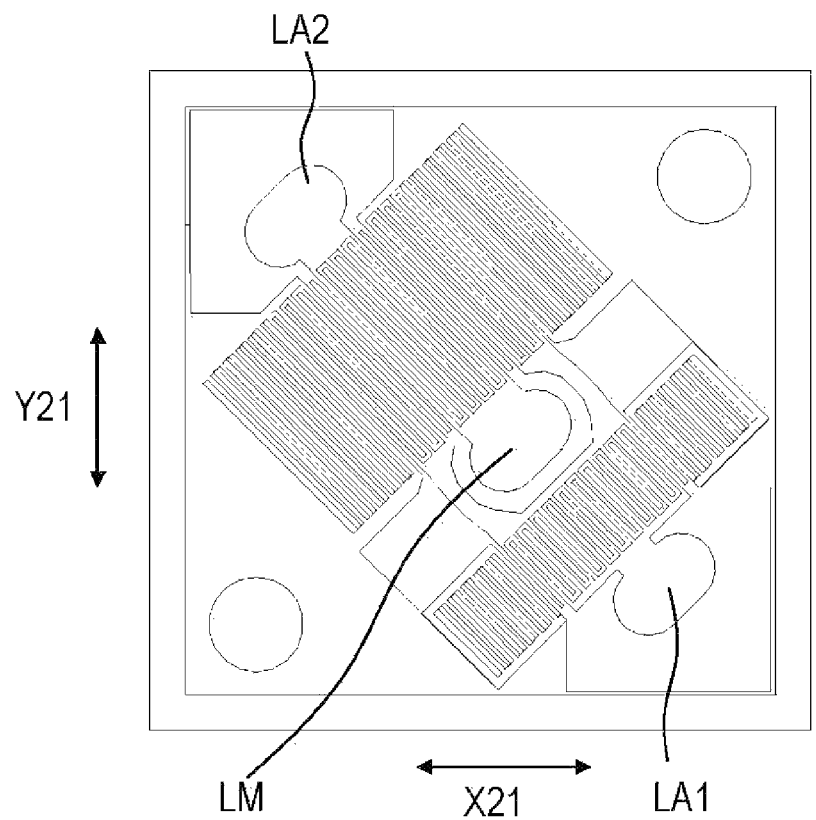
FIG. 21 shows a filter similar to FIG. 19 having diagonal alignment

FIG. 21 shows a modified chip layout for a DMS filter having additional resonators for asymmetrical/symmetrical operation without impedance transformation as the nineteenth embodiment. The SAW filter comprises a DMS track and a track having a series resonator.

The series resonator is applied to the asymmetrical gate, the insulated bond pad LA1 being electrically connected to the busbar of the series resonator. The DMS track is applied to the symmetrical gate.

The DMS track comprises a middle interdigital transducer, the two external interdigital transducers, and a reflector at each end. The two busbars of the middle interdigital transducer are each expanded into an insulated bond pad LA1, LM and together form the symmetrical gate.

The external interdigital transducers are connected on one side to the ground bond pad of the neighboring reflector, and on the other side the two busbars are combined and electrically connected to the series resonator. A series circuit made of resonator and DMS track thus results from the asymmetrical gate to the symmetrical gate.

In contrast to the embodiment 17, the acoustic tracks are positioned parallel to the chip diagonals. The signal flow of the component from the input to the output is diagonal from the input bond pad LA1 to the output bond pad LA2 and/or vice versa.

In order to obtain the smallest possible chip dimension in the x and y directions, the solder metal platings for the insulated bond pads LA1, LA2, LM are flattened in such a way that the acoustic tracks may be shifted close together. Depending on the application, two or even four ground bond pads M may be used, flattening of the solder metal platings of the ground bond pads is usually not necessary.

Overall, the layout is axially symmetrical in relation to the diagonal from the input to the output. A reduction of the chip size in the x and y directions results in relation to an embodiment having circular bond pads.

Figure 22:
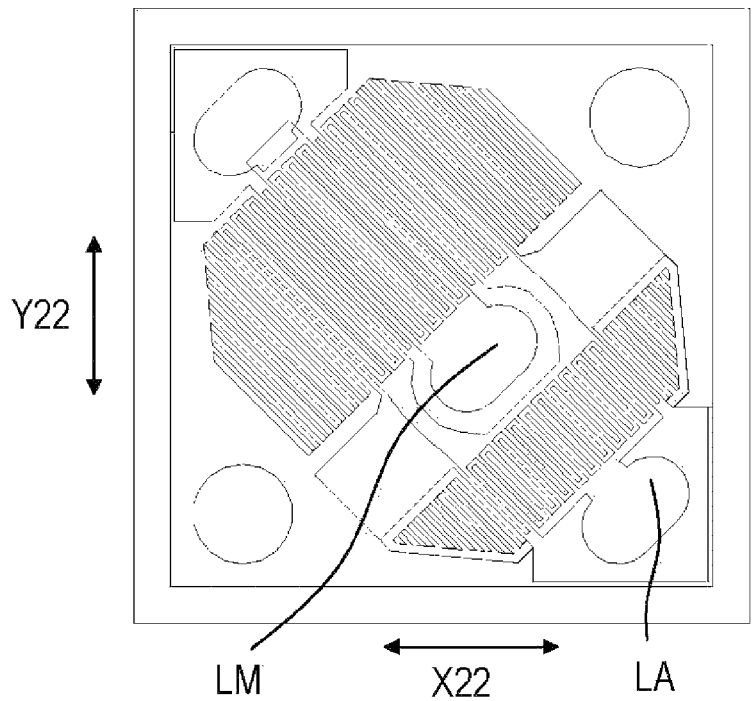
FIG. 22 shows a filter similar to FIG. 21, in which additional reflectors are beveled

FIG. 22 shows a modified chip layout for a DMS filter having additional resonators for asymmetrical/symmetrical operation without impedance transformation as the twentieth embodiment. In addition to the arrangement of the nineteenth embodiment, the reflector structures and the DMS track and the series resonator are now also beveled. In spite of maintaining the predefined safety interval between the acoustic structures and bond pads unchanged relative to the nineteenth embodiment, a further reduction of the chip size in the x and y directions results.

Since the embodiments 17-20 only dispense with the second series resonator in comparison to the embodiments 13-16, but are otherwise comparable, they may also be used for asymmetrical/asymmetrical operation. In this case, one of the two insulated bond pads on the symmetrical gate becomes a further ground bond pad.

Figure 23:
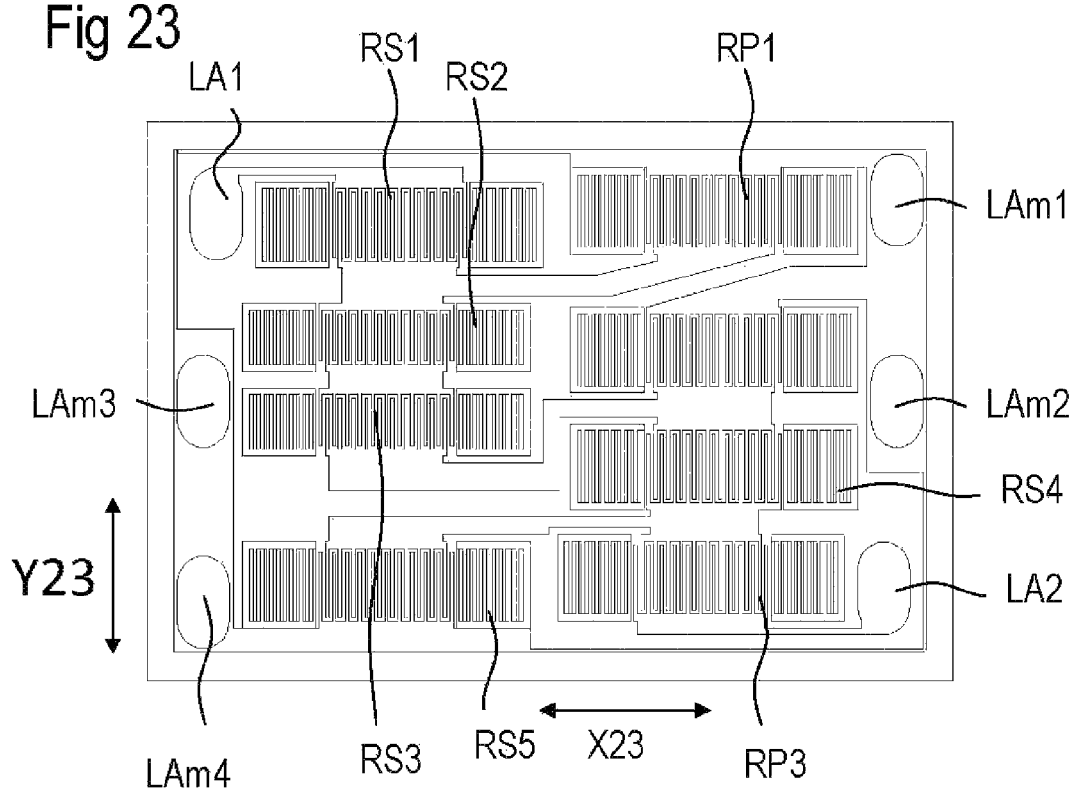
FIG. 23 shows a ladder-type filter having externally positioned non-round solder metal platings

FIG. 23 shows a modified chip layout for a ladder-type filter for asymmetrical/asymmetrical operation without impedance transformation as the twenty-first embodiment. The SAW filter comprises multiple series and parallel resonators which are connected to create base elements.

A ladder-type filter comprises at least one ladder base element, which is composed of a first resonator RS (series resonator) connected in series from the input to the output and a second resonator RP (parallel resonator) connected in parallel to ground. A single resonator typically has an interdigital transducer structure including two busbars and bond pads and a reflector on each end. Usually, multiple such base elements are electrically connected in series one behind another, resonators of an identical type often being combined into one acoustic track.

In the twenty-first embodiment, a series resonator RS is applied to each of the two asymmetrical gates. The overall structure may be described as a sequence of resonators from the input to the output, in this example ser-par-ser-ser-par-ser-par-ser (ser: serial, par: parallel). Some of the resonators already represent a combination of two resonators of the same type, for the second and third series resonators RS2, RS3 this was not done as an example.

To electrically connect two series resonators, the output busbar of the first series resonator RS1 is linked to the input busbar of the second series resonator RS2 using a line. A branch of this connection line to the input busbar of the parallel resonator RP1 generates the electrical connection of the parallel resonator lying between them. Only the external busbar of the parallel resonators RP and of the first and last series resonators RS1, RS5, to which no further resonator is connected to, are expanded into bond pads. The reflectors are either electrically connected to the ground bond pad $LA_m$ or "floating". In order to obtain the smallest possible chip dimension in the x and y directions, the solder metal platings for the insulated bond pads LA are placed laterally next to the tracks and implemented as ellipsoidal, so that the acoustic tracks may be shifted close together. Depending on the application, two or even four ground bond pads may be used.

Because of the flattening of the solder metal platings in the x direction, a reduction of the chip size in the x direction results in relation to the embodiment having circular solder metal platings.

FIG. 23 is merely here to show as an example how an embodiment according to the present invention may appear in the case of a ladder-type filter. Since the number of base elements used and their arrangement may vary greatly in ladder-type filters, many further variation possibilities are given. The present invention is therefore not restricted to this special embodiment.

Figure 24:
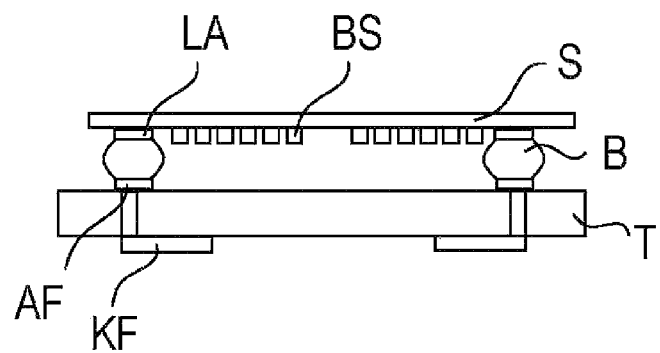
FIG. 24 shows a component according to the present invention having a carrier in schematic cross-section.

Only the layouts of the chips, i.e., the arrangement of the component structures on the substrate, are shown in FIGS. 2 through 23. FIG. 24 now shows, on the basis of a schematic cross-section, how the substrate may be bonded to a carrier.

There are component structures BS, which implement a SAW filter, for example, on a piezoelectric substrate (chip) S. Solder metal platings LA, which are flattened according to the present invention, having different dimensions along two axes, for example, are electrically connected to the component structures BS. A single-layer or multilayered carrier T, which may be part of the housing, has connection areas AF, which are soldered via solder bumps and/or bump connections B to the corresponding solder metal platings LM. In this case, the bump connection particularly has its area dimensioned in such a way that the entire component comprising carrier and chip obtains a sufficient mechanical stability. Contact areas KF may be provided on the bottom of the carrier, using which the component may be soldered in an external circuit environment, e.g., on a circuit board. The component may additionally be sealed from the substrate side using a film which terminates it tightly in relation to the carrier or a cover from environmental influences.

A flip chip arrangement is an electrically and mechanically connected arrangement of substrate and carrier, in which the connection points on substrate and carrier, here the bond pads, are positioned directly opposite one another. The flip chip arrangement is advantageous in any case when component structures are positioned between substrate and carrier and are mechanically protected there, as in the exemplary embodiment specified. However, the present invention is not restricted to components in which the component structures are positioned between substrate and carrier.

A further advantage of the flip chip arrangement is that a simple encapsulation, which projects over the chip (substrate S) only slightly or not at all, may thus be obtained.

Therefore, using chip sizes reduced according to the present invention, the housing and therefore the finished components may also have their dimensions reduced, since their minimum size is decisively determined by the chip size.

The scope of the present invention is not restricted to the embodiment specified. The technical teaching of the present invention and therefore the protective scope extends beyond the exemplary embodiment. The following are listed here as examples of possible expansions and modifications:

use of more than one chip on a housing and/or carrier, each of which is implemented per se according to the present invention, however use of a different filter technology than those described here another shape of the solder metal platings components other than SAW or BAW filters or combination of SAW or BAW filters with further components.

The invention claimed is:

1. An electrical component comprising:
a substrate having a surface;
component structures connected to the surface of the substrate; and
solder metal platings electrically connected to the component structures;
wherein the substrate is electrically and mechanically connected in a flip chip arrangement to a carrier via connections formed by solder bumps, the solder bumps mating to the solder metal platings;
wherein at least one of the solder bumps is on a first solder metal plating;
wherein the first solder metal plating has first and second dimensions, the first dimension being larger than the second dimension, the first and second dimensions being along a same surface that is parallel to the surface of the substrate; and
wherein the first solder metal plating is elliptical in shape, circular in shape, or rectangular in shape containing only rounded ends.

2. The electrical component of claim 1, wherein the component structures and the solder metal platings are on a same surface of the substrate.

3. The electrical component of claim 2, wherein the first solder metal plating is between an edge of the substrate and the component structures; and
wherein the first dimension is substantially parallel to the edge.

4. The electrical component of claim 2, wherein the first solder metal plating is between at least two of the component structures; and
wherein the first dimension is substantially parallel to an edge of a component structure.

5. The electrical component of claim 1, wherein the component structures comprise a surface acoustic wave filter.

6. The electrical component of claim 5, wherein the surface acoustic wave filter comprises an interdigital transducer and a reflector, the reflector comprising reflector fingers.

7. The electrical component of claim 6, wherein the reflector is beveled and at least one of the solder metal platings is at least partially in an area that is not covered by a beveled reflector.

8. The electrical component of claim 7, wherein the beveled reflector comprises a first group of reflector fingers and a second group of reflector fingers, the first group being closer to the interdigital transducer than the second group; and reflector fingers in the second group have different lengths.

9. The electrical component of claim 8, wherein the first group comprises 20 to 50 reflector fingers.

10. The electrical component of claim 5, wherein the surface acoustic wave filter comprises a DMS filter.

11. The electrical component of claim 1, wherein at least one of the component structures comprises a surface acoustic wave filter having a DMS filter type and resonators connected thereto.

12. The electrical component of claim 1, wherein at least one of the component structures comprises a ladder-type filter.

13. The electrical component of claim 1, wherein the substrate comprises a piezoelectric substrate.

14. The electrical component of claim 13, wherein the piezoelectric substrate comprises at least one of $LiTaO_3$ and $LiNbO_3$.

15. The electrical component of claim 1, wherein the substrate comprises silicon.

16. The electrical component of claim 1, wherein at least one of the component structures comprises a bulk acoustic wave filter.

17. The electrical component of claim 1, wherein the substrate is substantially rectangular and at least some of the component structures are oriented substantially parallel to a diagonal axis of the substrate.

18. The electrical component of claim 17, wherein the first solder metal plating is substantially on the diagonal axis.

19. The electrical component of claim 1, wherein at least one of the component structures comprises a high-frequency filter.

* * * * *